(12) United States Patent
Boescke et al.

(10) Patent No.: US 7,723,771 B2
(45) Date of Patent: May 25, 2010

(54) ZIRCONIUM OXIDE BASED CAPACITOR AND PROCESS TO MANUFACTURE THE SAME

(75) Inventors: Tim Boescke, Dresden (DE); Uwe Schroeder, Dresden (DE)

(73) Assignee: Qimonda AG, Munich (DE)

( * ) Notice: Subject to any disclaimer, the term of this patent is extended or adjusted under 35 U.S.C. 154(b) by 446 days.

(21) Appl. No.: 11/731,457

(22) Filed: Mar. 30, 2007

(65) Prior Publication Data

US 2008/0237791 A1    Oct. 2, 2008

(51) Int. Cl.
*H01L 27/108* (2006.01)

(52) U.S. Cl. .............. 257/310; 257/532; 257/E27.084; 257/E21.646; 438/240; 438/393; 438/783; 438/784; 438/785

(58) Field of Classification Search ................ 257/295, 257/310, 532, E27.084, E21.646; 438/3, 438/240, 393, 785, 783, 784
See application file for complete search history.

(56) References Cited

U.S. PATENT DOCUMENTS 7,064,043 B1 *   6/2006   Rouse ........................ 438/396

* cited by examiner

*Primary Examiner*—M. Wilczewski
*Assistant Examiner*—Toniae M Thomas
(74) *Attorney, Agent, or Firm*—Fay Kaplun & Marcin, LLP

(57) ABSTRACT

A capacitor structure comprises a first and a second electrode of conducting material. Between the first and second electrodes, an atomic layer deposited dielectric film is disposed, which comprises zirconium oxide and a dopant oxide. Herein, the dopant comprises an ionic radius that differs by more than 24 pm from an ionic radius of zirconium, while the dielectric film comprises a dopant content of 10 atomic percent or less of the dielectric film material excluding oxygen. A process for fabricating a capacitor comprises a step of forming a bottom electrode of the capacitor. On the bottom electrode, a dielectric film comprising zirconium oxide is deposited, and a step for introducing a dopant oxide into the dielectric film performed. On the dielectric structure, a top electrode is formed. The dopant comprises an ionic radius that differs by more than 24 pm from an ionic radius of zirconium, whereas the dielectric structure deposited comprises a dopant content of 10 atomic percent or less of the deposited material excluding oxygen.

36 Claims, 4 Drawing Sheets

ZIRCONIUM OXIDE BASED CAPACITOR AND PROCESS TO MANUFACTURE THE SAME

FIELD OF THE INVENTION

The present invention relates to a capacitor with a zirconium oxide based dielectric, and furthermore to a process for manufacturing a capacitor structure with a zirconium oxide based dielectric, as well as a semiconductor memory device comprising the same.

BRIEF DESCRIPTION OF THE DRAWINGS

In the Figures.

In the Figures, like numerals refer to the same or similar functionality throughout the several views.

DETAILED DESCRIPTION OF THE INVENTION

A method for fabricating a capacitor according to a first embodiment is illustrated by making reference to FIGS. 1A through 1D. Initially, an electrically conducting layer 100 is provided that is to serve as the bottom electrode 100 of the capacitor and forms a base onto which a dielectric film is to be deposited. The bottom electrode 100 is formed e.g. by depositing titanium nitride onto a substrate (not shown) by chemical vapor deposition or another suitable process. In alternative embodiments, the bottom electrode is formed of one or more of carbon, titanium silicon nitride, titanium carbon nitride, tantalum nitride, tantalum silicon nitride, tantalum carbon nitride, ruthenium, iridium, ruthenium oxide, and iridium oxide, either instead of or in addition to titanium nitride. For a capacitor for use in a memory device, the bottom electrode may e.g. be formed on a storage node of the memory device.

Figure 1A:
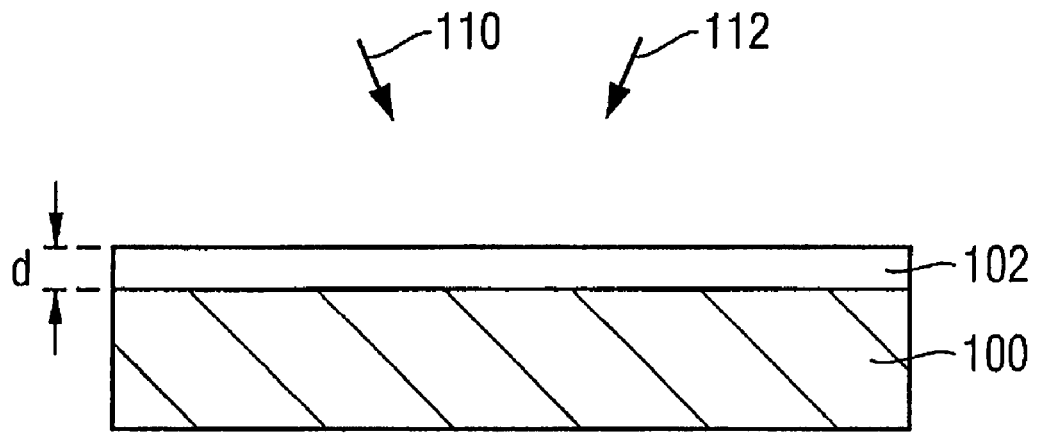
FIGS. 1A through 1D show schematic cross-sections of a manufacturing method for a capacitor according to an embodiment of the invention.

As shown in FIG. 1A, after the initial forming of the bottom electrode 100, in a first step of the present embodiment a thin dielectric layer 102 comprising zirconium oxide ($ZrO_2$) is deposited by an atomic layer deposition (ALD) method. After placing the substrate that bears the bottom electrode 100 in a reaction chamber, a first precursor 110 is introduced into the reaction chamber. The first precursor 110 is a compound to which a zirconium atom is coupled. As is generally known from atomic layer deposition techniques, the first precursor 110 covers the surface of the substrate 100 in the form of a fraction of a one-molecule thick layer. After removing excess amounts of the first precursor 110 by means of a vacuum pump or flushing with an inert gas, in sequence as a second precursor 112, water vapor ($H_2O$) is introduced into the reaction chamber. In alternative embodiments, ozone ($O_3$) or oxygen or oxygen plasma may be used as the second precursor 112. Water, ozone, oxygen, and oxygen plasma act as reactants, oxidizing the part of the first precursor 110 that is attached to the surface of the substrate 100 and therefore has not been removed by the evacuation or purging before introducing the second precursor 112. Due to the oxidation, the zirconium is decoupled from the precursor compound and oxidized by the water vapor, ozone, oxygen, or oxygen plasma 112. Thus, a complete or fractional monolayer of zirconium oxide is formed on the bottom electrode 100, where the degree of coverage depends on the amount of sterical hindrance between the molecules of the first precursor. The thickness d of the monolayer is determined by the molecular radius of zirconium oxide and lies in the range of approx. 0.4 nm. After the introduction of the first precursor 110, excess amounts of the second precursor 112 are now removed from the reaction chamber.

Figure 1B:
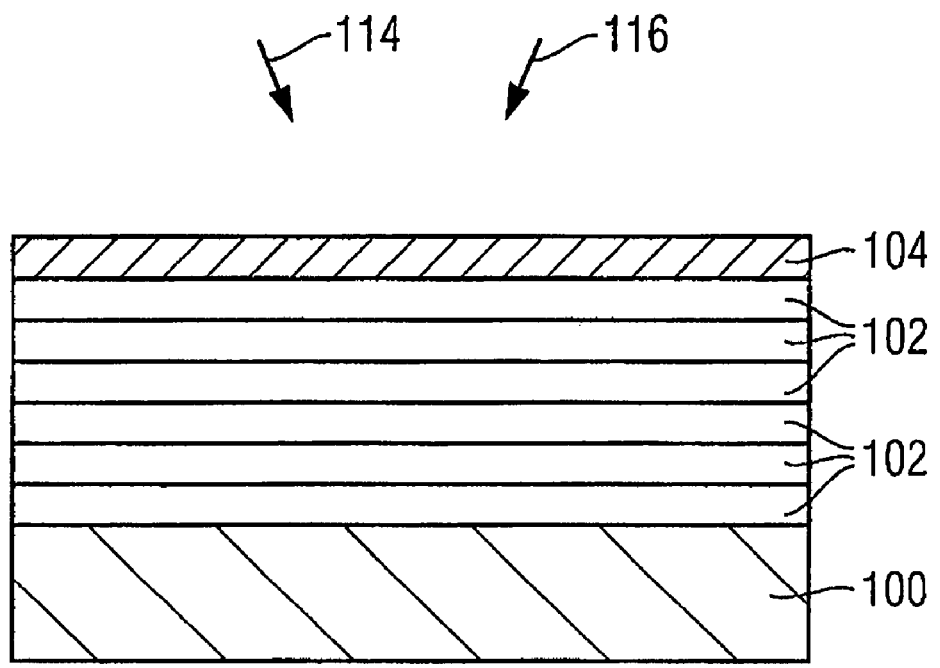

The deposition step described above and shown in FIG. 1A is now repeated several times, each time depositing a fractional or complete monolayer of zirconium oxide, thereby growing the zirconium oxide layer up to approximately half the desired thickness of the capacitor dielectric. This is schematically represented in FIG. 1B as six monolayers 102 of zirconium oxide, where for simplicity of display it has been assumed that each deposition step results in a complete monolayer. The actual number of deposition steps corresponding to the desired thickness may be different.

As shown in FIG. 1B, a third precursor 114 comprising a silicon-containing compound is next introduced into the reaction chamber. In the same way as the first precursor covered the surface of the bottom electrode 100 in the form of a, complete or fractional, monolayer, the third precursor 114 now covers the surface of the zirconium-containing monolayer 102, forming a further, complete or fractional, monolayer 104 of silicon-containing material. After an excess amount of the third precursor 114 has been removed from the reaction chamber, a fourth precursor 116 is introduced as a reactant to oxidize the third precursor 114, thus forming a monolayer 104 of silicon oxide stacked on top of the topmost monolayer 102 of zirconium oxide. The reactant introduced as fourth precursor 116 may comprise at least one of water vapor, ozone, oxygen, or oxygen plasma. Optionally, the same reactant used as the second precursor is also used as the fourth precursor 116, thus reducing the number of different precursors used.

Figure 1C:
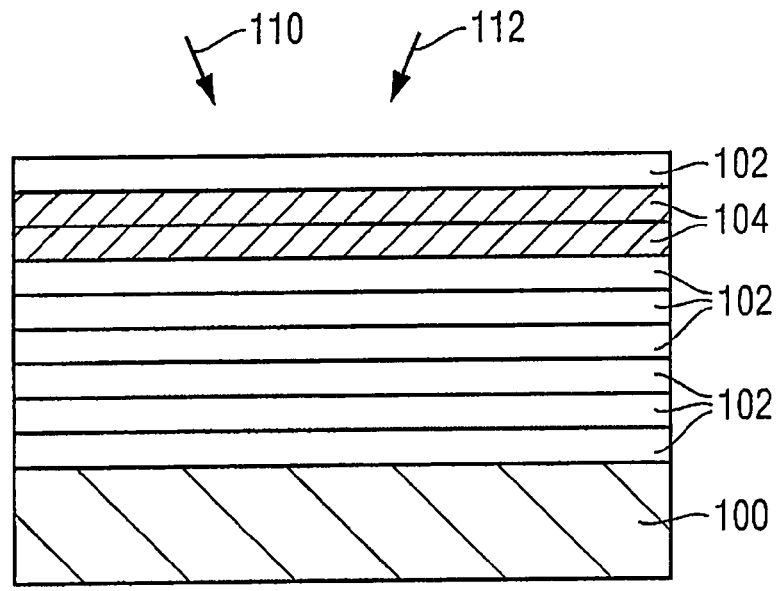

The step of depositing silicon oxide that is described above and shown in FIG. 1B is now optionally repeated one or more times, such that a layer of silicon oxide is formed, the thickness of which corresponds to a concentration of 2 atomic percent of silicon in the dielectric 106 of the capacitor to be manufactured, not counting the oxygen content of the dielectric 106. This is schematically represented in FIG. 1C as two monolayers 104 of silicon oxide, where for simplicity of display it has been assumed that each deposition step results in a complete monolayer. The actual number of deposition steps corresponding to the desired silicon concentration may be different.

Figure 1D:
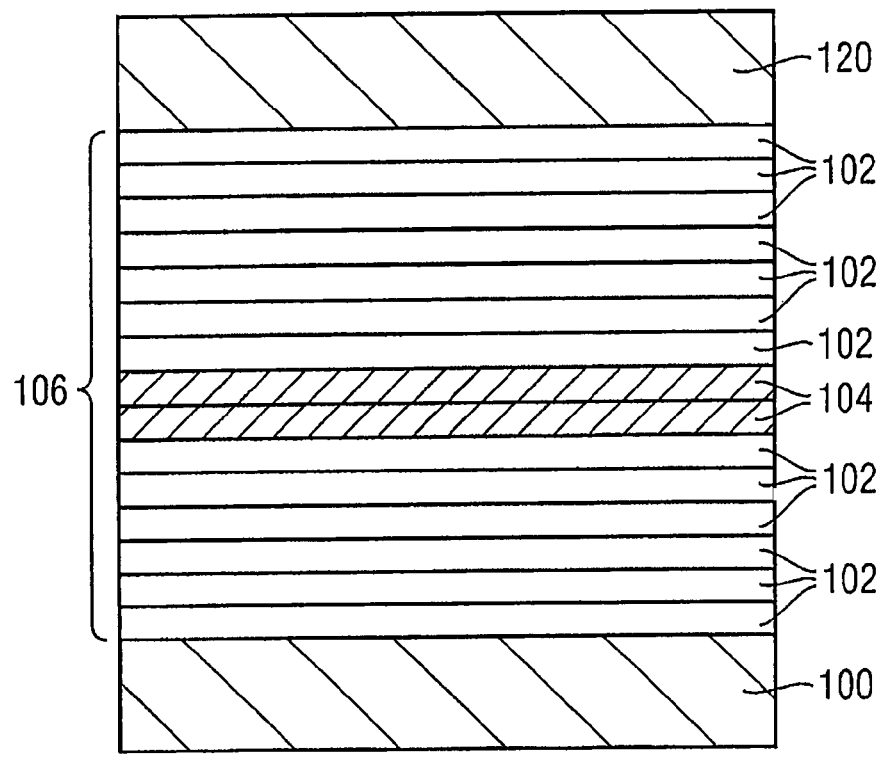

As shown in FIG. 1C, the step of depositing fractional or complete monolayers of zirconium oxide that was described referring to FIG. 1A is furthermore repeated, thus forming an additional monolayer 102 of zirconium oxide on top the monolayers 104 of silicon oxide. As shown in FIG. 1D, the deposition step is repeated for approximately the same number of repetitions as the same step was repeated before the deposition of silicon oxide described above. This is schematically represented in FIG. 1D as seven monolayers 102 of zirconium oxide, where for simplicity of display it again has been assumed that each deposition step results in a complete monolayer. The actual number of deposition steps may be different.

In this way, a dielectric 106 is formed for the capacitor that comprises zirconium oxide 104 at 98 atomic percent of zirconium content in the dielectric, not taking into account the oxygen content of the dielectric. A layer of silicon oxide 102 representing 2 atomic percent of silicon in the dielectric is interspersed approximately in the center of the dielectric layer 106.

In alternative embodiments, the layer of silicon oxide 102 is formed within the dielectric 106 at a position further away from the center, including arrangements, where the layer of silicon oxide is placed in direct contact with the bottom electrode 100, or with the top electrode 120. In a further alternative embodiment, the first and second precursors 110 and 114 are introduced simultaneously into the reaction chamber to form a zirconium and silicon containing layer in a single step. After evacuation or purging, water vapor, ozone, oxygen or oxygen plasma 112, 116 are introduced to oxidize the zirconium and silicon containing layer.

The ALD deposition steps described above are performed at a reaction temperature of between 275° C. and 350° C. In alternative embodiments, the reaction temperature is chosen from the range of 200° C. to 500° C. Optionally, an annealing step is performed at a temperature between 350° C. and 500° C., in an atmosphere comprising at least one of nitrogen, ammonia, nitrogen oxide, and oxygen.

Finally, a top electrode 120 is formed by depositing a layer of titanium nitride on top of the dielectric 106 deposited as described above. In alternative embodiments, the top electrode 120 is formed of at least one of titanium nitride, titanium silicon nitride, titanium carbon nitride, tantalum nitride, tantalum silicon nitride, tantalum carbon nitride, ruthenium, iridium, ruthenium oxide, and iridium oxide, either instead or in addition to titanium nitride.

In the embodiments described so far, silicon oxide was used as a dopant oxide for doping the dielectric layer, which predominately comprises zirconium oxide as base material. Silicon comprises an ionic radius of 40 pm, which differs by approximately 32 pm from the ionic radius of zirconium, which is 72 pm. In some embodiments, this ionic radius mismatch may have the effect of increasing the crystallization temperature, e.g. in proportion to the square of the respective ionic radius mismatch, enabling the dielectric to be deposited at higher temperatures without crystallization during deposition. In alternative embodiments, silicon is substituted as a dopant by further chemical elements comprising radii that differ from the ionic radius of zirconium by 30 pm or more, including lanthanum (106 pm) strontium (112 pm), and barium (135 pm), or by chemical elements comprising radii that differ from the ionic radius of zirconium by 24 pm or more, including calcium (99 pm), neodymium (99.5 pm), and samarium (96.4 pm).

Figure 2:
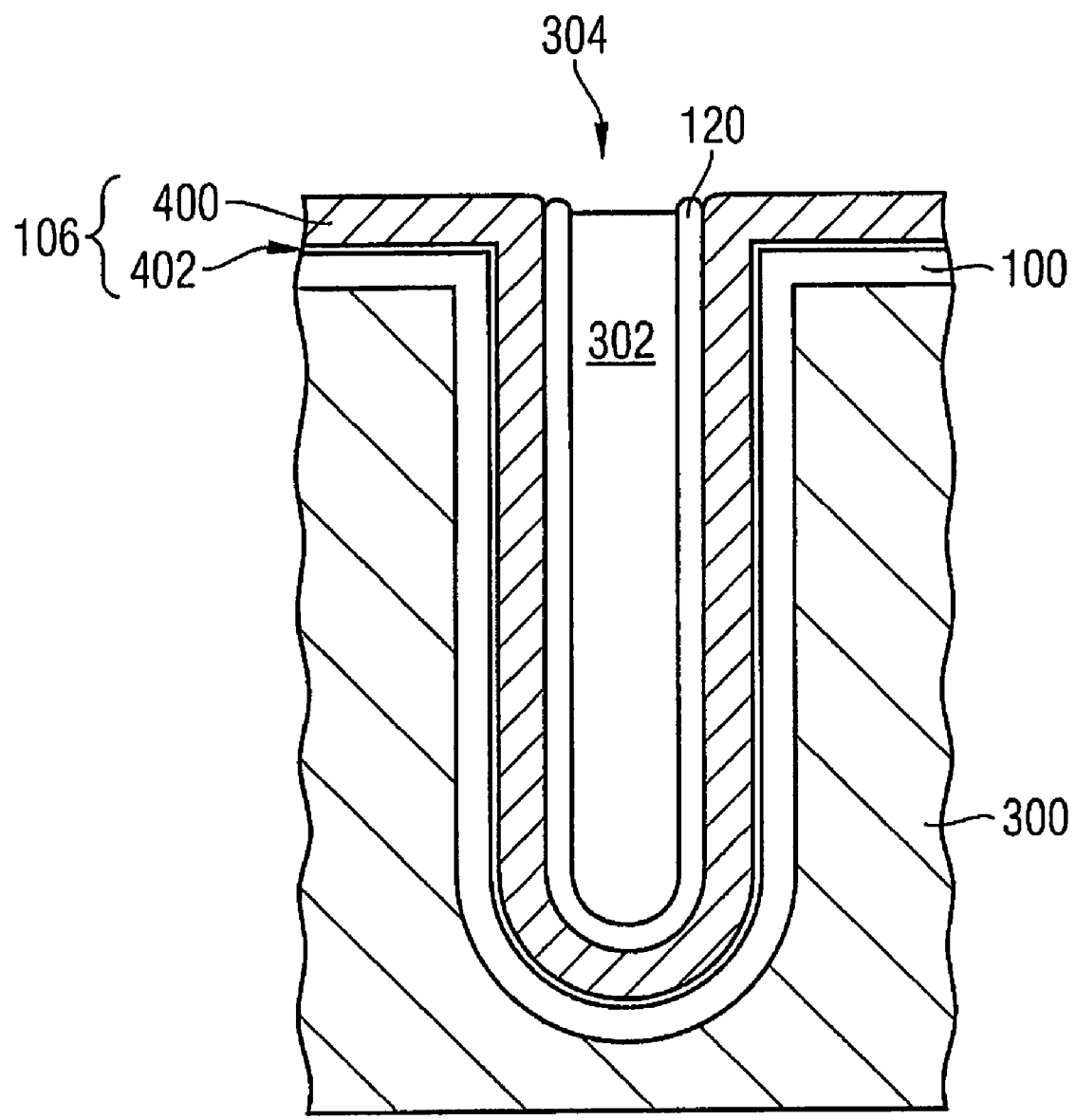
FIG. 2 shows a schematic cross-section of a trench-type capacitor according to an embodiment of the invention.

FIG. 2 shows a cross section of a trench-type capacitor structure according to an embodiment, formed inside a trench 304 on a silicon substrate 300. The capacitor comprises a first electrode 100, a dielectric film 106, and a second electrode 120. On the trench-containing silicon substrate 300, the bottom electrode is e.g. formed of ruthenium by a standard deposition technique such as chemical vapor deposition. The dielectric film 106 comprises a lanthanum oxide layer 402 deposited on top of the bottom electrode, and a zirconium oxide layer 400 deposited on top of the lanthanum layer 402, both by atomic layer deposition. The overall thickness of the dielectric film 106 is 8 nm, with a thickness of the lanthanum oxide layer 402 of 0.24 nm, corresponding to 3% of the overall thickness of the dielectric film 106. On top of the dielectric film 106, a top electrode 120 made of tantalum nitride has been deposited, e.g. by chemical vapor deposition, and the trench 304 filled with polysilicon.

Figure 3:
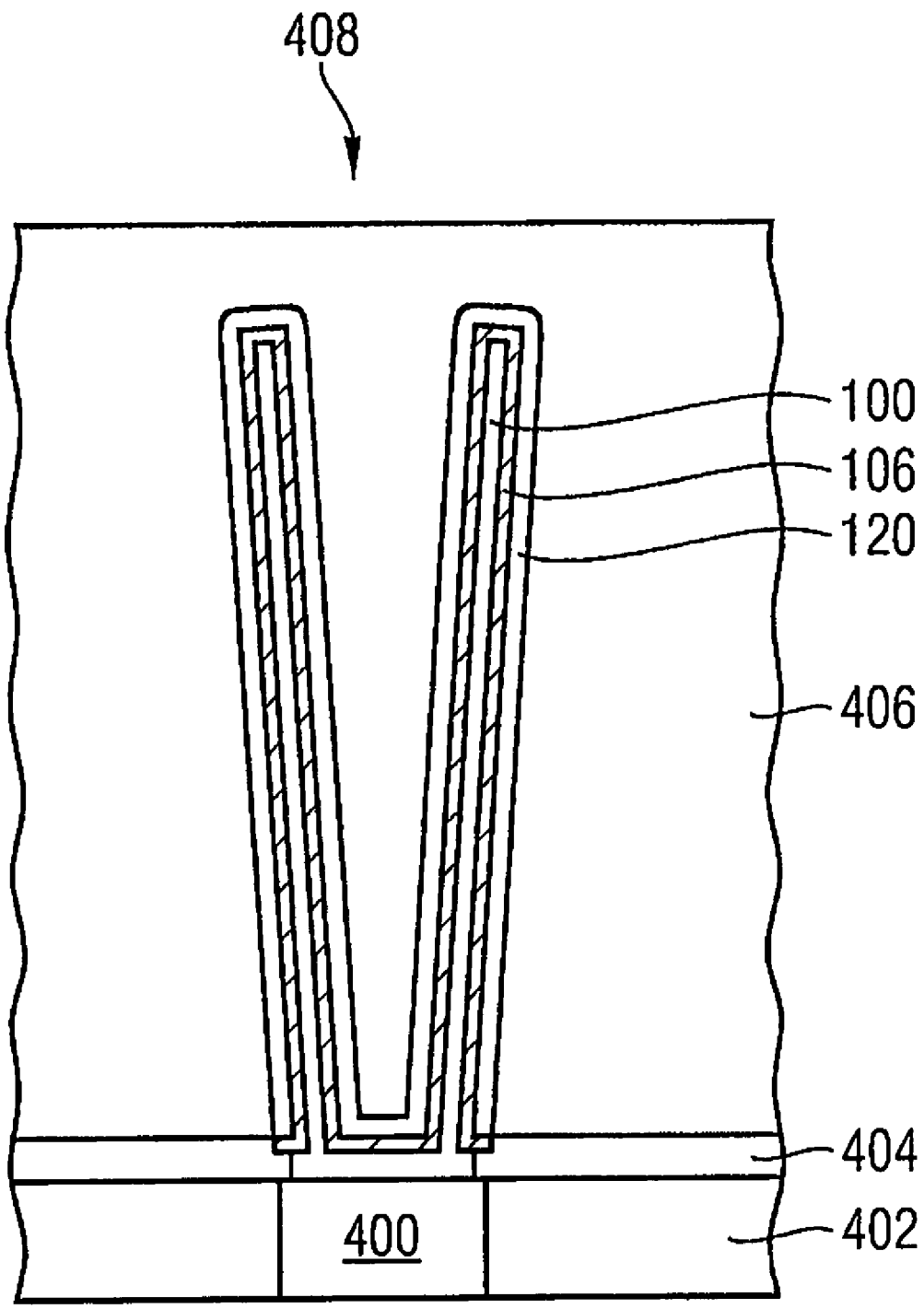
FIG. 3 shows a schematic cross-section of a stack-type capacitor according to an embodiment of the invention.

FIG. 3 shows a cross section of a stacked-type capacitor 408 structure according to another embodiment. The stacked-type capacitor 408 comprises a cylinder-shaped first electrode 100 formed e.g. of tantalum carbon nitride, a dielectric film 106 deposited by atomic layer deposition on both the inside and outside of the first electrode 100, and a second electrode 120 formed e.g. of iridium oxide. The dielectric film comprises zirconium oxide containing sublayers, silicon oxide containing sublayers and aluminum containing sublayers deposited in respective atomic-layer deposition cycles. The respective overall content of zirconium, silicon, and aluminum among the non-oxygen atoms in the dielectric film is 93 atomic percent, 4 atomic percent, and 3 atomic percent. The thickness of the dielectric 106 is in alternative embodiments about 5-15 nm. A contact plug 400 is provided for connecting the first electrode 100. The contact plug 400 is initially formed in an insulating oxide layer 402 covered by a suitably patterned etch stop layer 404 by etching and filling with a conductive material. A conductive plate layer 406 covers the capacitor 408 structure.

Although the present invention has been described with reference to the above embodiments, it is not limited thereto, but can be modified in various manners which are obvious for persons skilled in the art. Thus, it is intended that the present invention is only limited by the scope of the claims attached herewith.

For example, a capacitor may be formed as a cup-type, block-type, or planar capacitor. As another example, the ALD processes as illustrated in FIGS. 1A through 1C may be substituted by pulsed chemical vapor deposition (pulsed CVD) processes, each respectively delivering a controlled pulse of a zirconium containing precursor and a dopant containing precursor into the reaction chamber. Between the pulses, the reaction chamber is cleaned out e.g. by flushing with an inert gas. The thickness of the thin layers formed by each CVD pulse may not as exactly defined as for the monolayers deposited by ALD processes, which makes ALD the preferred choice for the inventive fabrication process.

What is claimed is:

1. A method for fabricating a capacitor, comprising:
   forming a bottom electrode;
   depositing a dielectric film comprising zirconium oxide on the bottom electrode;
   a step for introducing a dopant oxide into the dielectric film; and
   forming a top electrode on the dielectric film;
   wherein the dopant comprises an ionic radius that differs by more than 24 pm from an ionic radius of zirconium, and the dopant is introduced up to a dopant content of at most 10 atomic percent of the dielectric film material excluding oxygen.

2. The method of claim 1, wherein the dopant is introduced up to a dopant content of at most 5 atomic percent of the dielectric film material excluding oxygen.

3. A method for fabricating a capacitor, comprising:
   forming a bottom electrode;
   depositing a dielectric structure on the bottom electrode comprising at least one zirconium oxide layer and at least one dopant oxide layer using atomic layer deposition; and
   forming a top electrode on the dielectric structure;
   wherein the dopant comprises an ionic radius that differs by more than 24 pm from an ionic radius of zirconium, and the dielectric structure deposited comprises a dopant content of 10 atomic percent or less of the deposited material excluding oxygen.

4. The method of claim 3, wherein the dielectric structure deposited comprises a dopant content of 5 atomic percent or less of the deposited material excluding oxygen.

5. The method of claim 3, wherein the dopant is selected from the group containing silicon, calcium, strontium, barium, lanthanum, neodymium, and samarium.

6. The method of claim 3, wherein the dielectric structure deposited comprises at least one layer comprising aluminum oxide.

7. The method of claim 3, wherein the bottom electrode comprises at least one of carbon, titanium nitride, titanium silicon nitride, titanium carbon nitride, tantalum nitride, tantalum silicon nitride, tantalum carbon nitride, ruthenium, iridium, ruthenium oxide, and iridium oxide.

8. The method of claim 3, wherein the top electrode comprises at least one of titanium nitride, titanium silicon nitride, titanium carbon nitride, tantalum nitride, tantalum silicon nitride, tantalum carbon nitride, ruthenium, iridium, ruthenium oxide, and iridium oxide.

9. The method of claim 3, wherein the dielectric structure is deposited at a temperature of between 200° C. and 500° C.

10. The method of claim 9, wherein the dielectric structure is deposited at a temperature of between 275° C. and 350° C.

11. The method of claim 3, further comprising performing a step of annealing the dielectric structure at a temperature of between 300° C. and 600° C.

12. The method of claim 11, wherein the annealing is performed at a temperature between 350° C. and 500° C.

13. The method of claim 11, wherein the annealing is performed in an atmosphere comprising at least one of nitrogen, ammonia, nitrogen monoxide, nitrogen dioxide, argon, hydrogen, and oxygen.

14. The method of claim 3, further comprising applying a plasma nitridation step to the dielectric structure.

15. A deposition method for depositing a zirconium oxide comprising dielectric film for a capacitor, the method comprising:
providing an electrically conductive layer;
applying sequentially a first precursor comprising a zirconium containing compound, and a second precursor predominantly comprising at least one of water vapor, ozone, oxygen, and oxygen plasma, for depositing above the electrically conductive layer a layer of a zirconium containing material; and
applying sequentially a third precursor comprising a dopant containing compound, and a fourth precursor predominantly comprising at least one of water vapor, ozone, oxygen, and oxygen plasma for depositing above the substrate a layer of a dopant containing material;
wherein a dopant content of the dielectric film deposited is 10 atomic percent or less of the deposited material excluding oxygen, and the dopant comprises an ionic radius that is less than or greater than an ionic radius of zirconium by at least 24 pm.

16. The deposition method according to claim 15, wherein the dopant content of the dielectric film deposited is 5 atomic percent or less of the deposited material excluding oxygen.

17. The deposition method according to claim 15, wherein the dopant comprises an ionic radius that is less than or greater than an ionic radius of zirconium by at least 30 pm.

18. The deposition method according to claim 15, wherein the dopant comprises at least one of silicon, calcium, strontium, barium, lanthanum, neodymium, and samarium.

19. The deposition method according to claim 15, further comprising applying sequentially a fifth precursor comprising an aluminum containing compound, and a sixth precursor predominantly comprising at least one of water vapor, ozone, oxygen, and oxygen plasma for depositing above the substrate a layer of an aluminum containing material.

20. The deposition method according to claim 15 wherein the first precursor and the third precursor are applied simultaneously.

21. The deposition method according to claim 15 wherein at least one of the step of applying the first and second precursors, and the step of applying the third and fourth precursors is performed repeatedly for forming the dielectric film.

22. The deposition method according to claim 15 wherein the step of applying the first and second precursors, and the step of applying the third and fourth precursors are performed at a deposition temperature between 275° C. and 350° C.

23. The deposition method according to claim 15, further comprising a step of annealing at a temperature between 350° C. and 500° C.

24. The deposition method according to claim 15, further comprising a step of annealing in an atmosphere comprising at least one of nitrogen, ammonia, nitrogen monoxide, nitrogen dioxide, argon, hydrogen, and oxygen.

25. The deposition method according to claim 15 wherein the step of applying the first and second precursors, and the step of applying the third and fourth precursors are performed repeatedly in alternation.

26. The deposition method according to claim 15 wherein the step of applying the first and second precursors is repeated for between 50 and 500 times, and the step of applying the third and fourth precursors is repeated for between 1 and 50 times.

27. The deposition method according to claim 15, wherein the dielectric film is deposited at a thickness of between 5 and 50 nm.

28. The deposition method according to claim 15, wherein the first precursor comprises at least one compound selected from the group consisting of zirconium cyclopentadienyls, and zirconium alkyl amides.

29. The deposition method according to claim 15, wherein the third precursor comprises at least one compound selected from the group consisting of alkylsilylamides, beta-diketonates, cyclopentadienyls, alkoxides, and alkylamides.

30. A capacitor structure comprising:
a first and a second electrode of conducting material;
an atomic layer deposited dielectric film disposed between the first and second electrodes, the dielectric film comprising zirconium oxide and a dopant oxide,
wherein the dopant comprises an ionic radius that differs by more than 24 pm from an ionic radius of zirconium, and the dielectric film comprises a dopant content of 10 atomic percent or less of the dielectric film material excluding oxygen.

31. The capacitor structure according to claim 30, wherein the dielectric film comprises a dopant content of 5 atomic percent or less of the dielectric film material excluding oxygen.

32. The capacitor structure according to claim 30, wherein the dopant is selected from the group containing silicon, calcium, strontium, barium, lanthanum, neodymium, and samarium.

33. The capacitor structure according to claim 30, wherein the conducting material of at least one of the first and second electrodes comprises at least one of carbon, titanium nitride, titanium silicon nitride, titanium carbon nitride, tantalum nitride, tantalum silicon nitride, tantalum carbon nitride, ruthenium, iridium, ruthenium oxide, and iridium oxide.

34. An integrated circuit comprising a capacitor structure according to claim 30.

35. A semiconductor device comprising a plurality of capacitors, each comprising:
a bottom electrode;
a multilayered dielectric film of atomic-layer deposited sublayers on the bottom electrode, the sublayers including at least one zirconium oxide comprising sublayer and at least one silicon oxide comprising sublayer; and a top electrode formed on the dielectric film;
wherein the overall thickness of the at least one silicon oxide comprising sublayer is 10% or less of the thickness of the dielectric film and
wherein the semiconductor device is a memory device, comprising a plurality of memory cells each comprising one of the plurality of capacitors.

36. The semiconductor device according to claim 35, wherein one of the at least one zirconium sublayers is disposed between the bottom electrode and one of the at least one silicon oxide comprising sublayers.

* * * * *